(12) United States Patent
Jordan et al.

(10) Patent No.: US 8,248,164 B2
(45) Date of Patent: Aug. 21, 2012

(54) INTEGRATED CIRCUIT SINGLE ENDED-TO-DIFFERENTIAL AMPLIFIER

(75) Inventors: Andrew M. Jordan, Scarborough, ME (US); Hrvoje Jasa, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 12 days.

(21) Appl. No.: 12/874,800

(22) Filed: Sep. 2, 2010

(65) Prior Publication Data

US 2012/0056671 A1    Mar. 8, 2012

(51) Int. Cl.
*H03F 3/04* (2006.01)
(52) U.S. Cl. ........................................ 330/301; 330/252
(58) Field of Classification Search .................. 330/301, 330/116–117; 333/25–26
See application file for complete search history.

(56) References Cited

U.S. PATENT DOCUMENTS

7,812,675 B2 * 10/2010 Van Der Heijden et al. . 330/301
* cited by examiner

*Primary Examiner* — Hieu Nguyen
(74) *Attorney, Agent, or Firm* — Schwegman, Lundberg & Woessner, P.A.

(57) ABSTRACT

Apparatus and methods for an integrated circuit, single ended-to-differential amplifier are provided. In an example, the amplifier can include an amplifier circuit having a first input configured to receive a single-ended signal, a second input, and a differential output configured to provide an amplified representation of the single-ended signal. The amplifier can include a filter circuit configured to balance a common-mode voltage between the first and second inputs of the amplifier circuit. The filter circuit can include a common-mode input configured to receive the common-mode voltage, a first impedance network coupled between the common-mode input and the first input of the amplifier circuit, and a second impedance network coupled between the common-mode input and the second input of the amplifier circuit. The filter circuit can provide a low frequency pole below 1 hertz.

25 Claims, 5 Drawing Sheets

INTEGRATED CIRCUIT SINGLE ENDED-TO-DIFFERENTIAL AMPLIFIER

BACKGROUND

Generally, sensor circuits receive electrical signals from a transducer. The sensor circuit then amplifies the received signals to a desired level for processing. In some sensor circuits, the signal is biased and amplified to provide a differential output. Noise on power supplies, such as noise on a common mode power supply used to bias the signal, can interfere with the reception and amplification of received sensor signals. In some sensor circuits, filters are used to pass signals having certain frequencies of interest. Providing traditional filters in combination with or in proximity to power supplies or other circuits on an integrated circuit chip can limit the quality of signal processing of the filter due to distortion caused by the power supply or other circuits, as well as limit the ability of the filter to provide low frequency poles.

OVERVIEW

In an example, an integrated circuit, single ended to differential amplifier is provided. The amplifier can include an amplifier circuit having a first input configured to receive a single-ended signal, a second input, and a differential output configured to provide an amplified representation of the single-ended signal. The amplifier can include a filter circuit configured to balance a common-mode voltage between the first and second inputs of the amplifier circuit. The filter circuit can include a common-mode input configured to receive the common-mode voltage, a first impedance network coupled between the common-mode input and the first input of the amplifier circuit, and a second impedance network coupled between the common-mode input and the second input of the amplifier circuit. The filter circuit can provide a low frequency pole below 1 hertz.

In certain examples, an integrated circuit, high-impedance network is provided. The network can include an anti-parallel diode pair coupled between first and second nodes. The anti-parallel diode pair can include a first diode including a $P+/N_{WELL}$ junction and a second diode including $N+/P_{WELL}$ junction. In an example, the first diode and the second diode can include a common substrate. In an example, an integrated circuit network provides extremely high impedance using a very small area of circuit substrate. In an example, a high-impedance network can allow for extremely low frequency poles (e.g., as low as a fraction of a hertz) in an integrated circuit.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As integrated circuits have miniaturized, so to have the passive components associated with the circuits including capacitors and, in turn, the capacitance of such capacitors. Capacitors and impedance devices, such as resistors, can be used in filter circuits, for example, to establish poles of a filter. The poles of a filter can provide an indication of the ability of the circuit to pass or reject certain signal frequencies. For circuits that require low frequency poles, the shrinking capacitive level of integrated circuits have required either more area for capacitors or more area for larger impedance devices. The present inventors have developed a high-impedance network for use in integrated circuits that provides extremely high impedance using a very small chip area. High impedance devices can be used for on-chip filter circuits having very low frequency poles. Such poles can be on the order of a fraction of a hertz. The small size of the high-impedance network allows for use in integrated circuits without sacrificing substantial chip space. In various examples, distortion associated with a common-mode power supply of an integrated circuit filter can be reduced using one or more high-impedance networks integrated with the amplifier circuit. In some examples, an amplifier circuit requiring a high-quality, off-chip, common-mode supply can be modified with one or more high-impedance networks to allow integration of a lower quality, on-chip, common-mode supply with the integrated circuit amplifier, in certain examples without sacrificing performance of the amplifier or substantially increasing the size of the integrated circuit. These improvements can reduce costs and size associated with higher quality, off-chip supplies. In some examples, integration of one or more high-impedance networks according to the present subject matter can improve power supply rejection of an integrated amplifier circuit, thus, increasing the efficiency of the circuit while reducing the cost and size associated with traditional solutions.

Figure 1:
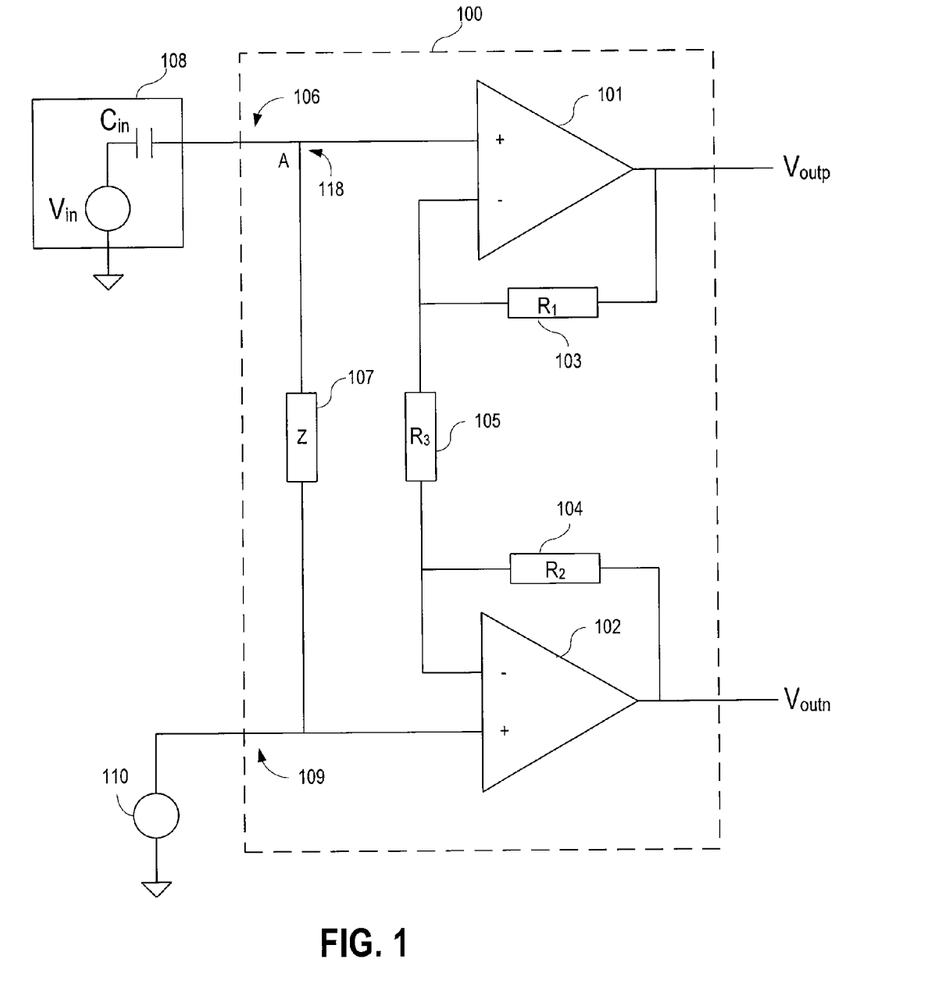
FIG. 1 illustrates generally an example of an amplifier.

FIG. 1 illustrates generally an example of a single-ended to differential amplifier circuit 100. The single-ended to differential amplifier circuit 100 can include a first amplifier 101 and a second amplifier 102 configured to receive a signal at a first input 106 (e.g., from a single-ended source 108) and to generate a differential output (e.g., Voutp to Voutn). In an example, a single-ended to differential amplifier circuit 100 can include one or more impedances sized to provide a desired level of amplification of a signal received on the first input 106. In the illustrated example, the one or more impedances can include first, second, and third resistors 103, 104, 105 sized to provide a desired level of amplification of a signal received on the first input 106. In certain examples, the single-ended to differential amplifier circuit 100 can include an impedance network 107 coupled between the non-inverting inputs of the first and second amplifiers 101, 102. The impedance network 107 can allow the non-inverting input of the first amplifier 101 to be biased, in certain examples, shifting the signal received at the first input 106, such that the dynamic range of the first and second amplifiers 101, 102 do not distort the signal or a portion of the signal that is of interest.

In an example, the single-ended to differential amplifier circuit 100 can include a second input 109. In an example, a common-mode voltage can be applied to the second input 109 that allows the outputs of the first and second amplifiers 101, 102 to vary within a linear operating range in response to the signal. In an example, where the impedance network 107 has a large impedance, the potential of the outputs of the first and second amplifiers 101, 102 can equal the voltage of a common-mode supply 110 applied to the second input 109 when signal source 108 is at 0 volts.

In an example, the gain of the single-ended to differential amplifier circuit 100 can be expressed as, $$\frac{V_{outp} - V_{outn}}{V_{in}} = \left(\left(1 + \frac{R_1}{R_3}\right) + \frac{R_2}{R_3}\right).$$

Assuming that the capacitance of the device coupled to the first input 106 is significantly higher than the capacitance of the first amplifier 101, a low frequency pole of the first input 106 can be defined by the capacitance $C_{in}$ of the device (e.g., the single-ended source 108) and the impedance Z of the impedance network 107, such that the voltage at node A 118, $V_A$, is expressed as, $$V_A = V_{in}\left(\frac{Z}{1 + j\omega Z C_{in}}\right).$$

Because a pole of the circuit can be found near a cutoff frequency $f_c$ equal to about, $$f_c = \frac{1}{2\pi Z C_{in}},$$

a lower frequency pole can be realized using a higher impedance Z.

However, the single-ended to differential amplifier circuit 100 of FIG. 1 has an impedance imbalance that requires an extremely high quality common-mode supply 110 to limit distortion in the output signal of the circuit 100. For example, the common-mode supply 110 is coupled directly to the non-inverting input of the second amplifier 102, thus, providing a very low impedance signal path between the common-mode supply 110 and the input to the second amplifier 102. A second signal path, including the impedance network 107, from the common-mode supply 110 to the non-inverting input of the first supply 101 has higher impedance than the first signal path. The impedance difference of the signal paths allow variation of the common-mode signal to influence the output of the single-ended to differential amplifier circuit 100 causing distortion of the amplified output of the input signal. Providing a high-quality common-mode voltage supply becomes more expensive, and the supply becomes larger, as the acceptable amount of voltage variation of the supply is reduced. Balancing these expenses and size constraints can result in either an on-chip supply having variation that distorts the processed signals, or a larger, off-chip supply, both of which can be more expensive to manufacture and more costly to maintain.

The present inventors have recognized, among other things, an extremely high impedance network that can be formed onto a very small area of an integrated circuit chip and be used to balance the impedance of an amplifier circuit, such as that similar to the single-ended to differential amplifier circuit 100 of FIG. 1. In addition, the improved circuit can tolerate a lower quality common-mode supply without sacrificing performance, and, in certain examples, the common-mode supply can be integrated on-chip with an integrated amplifier circuit without sacrificing performance. In some examples, the high impedance network can allow integrated circuits, such as filter or amplifier circuits, to have extremely low frequency poles.

Figure 2:
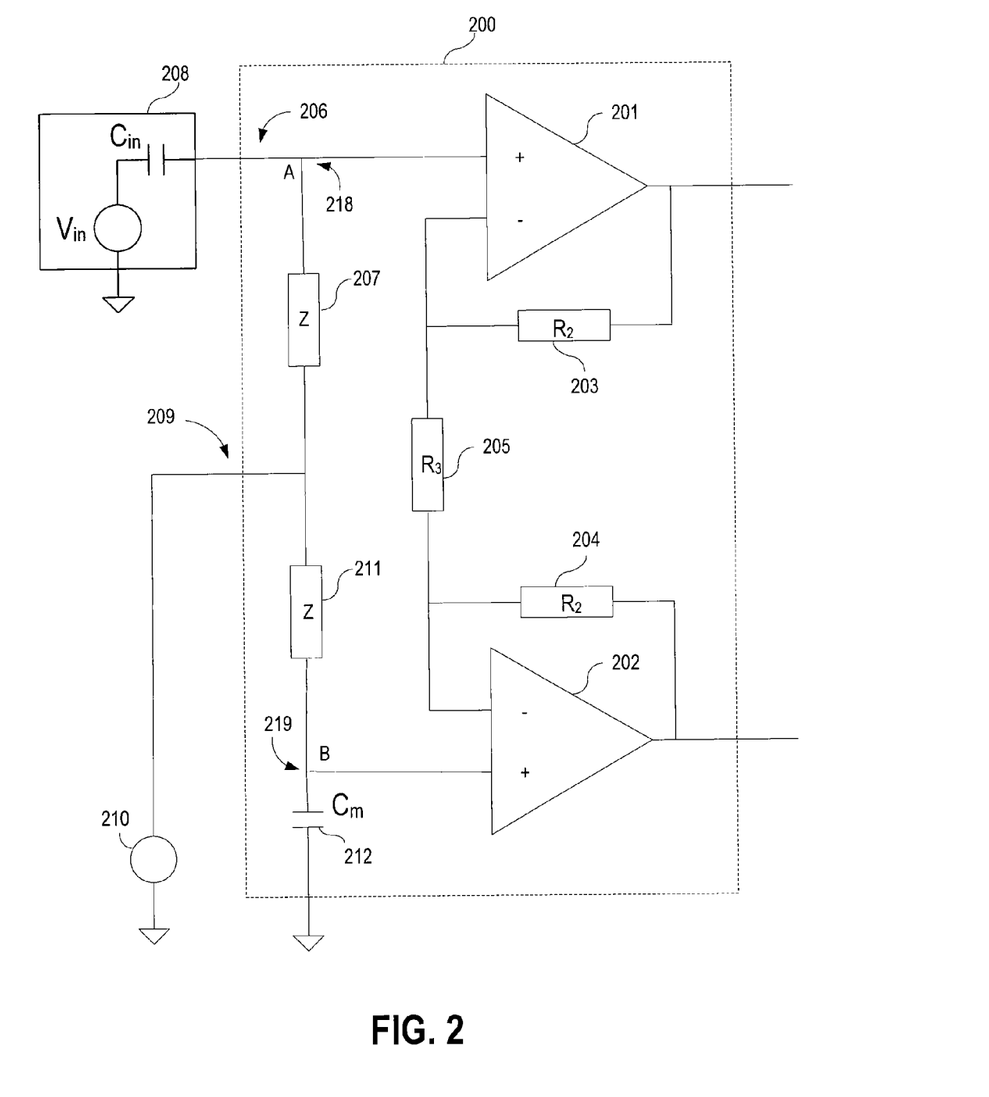
FIG. 2 illustrates generally an example of an impedance balanced amplifier.

FIG. 2 illustrates generally a single-ended to differential amplifier integrated circuit 200 according to one example of the present subject matter. The single-ended to differential amplifier circuit 200 (e.g., an integrated circuit) can include first and second amplifiers 201, 202 configured to receive a signal at a first input 206 (e.g., from a single-ended source 208) and to generate a differential output. In an example, a single-ended to differential amplifier circuit 200 can include one or more impedances sized to provide a desired level of amplification of a signal received on the first input 206. In the illustrated example, the single-ended to differential amplifier circuit 200 can include first, second, and third resistors 203, 204, 205 sized to provide a desired level of amplification of a single-ended signal received at the first input 206. The single-ended to differential amplifier circuit 200 can include first and second high-impedance networks 207, 211. The first high-impedance network 207 can couple between the non-inverting input of the first amplifier 201 and a second input 209, and can allow a signal received from the single-ended source 208 at the first input 206 to be biased, for example, to take advantage of the maximum dynamic range of the first and second amplifiers 201, 202. The second high-impedance network 211 can couple between the second input 209 and the non-inverting input of the second amplifier 202. The combination of the first and second high-impedance networks 207, 211 can provide a balanced impedance between signal paths including the non-inverting inputs of the first and second amplifiers 201, 202, and the second input 209. For example, a first signal path can include the second input 209, the first high-impedance network 207, and the non-inverting input of the first amplifier 201. A second signal path can include the second input 209, the second high-impedance network 211, and the non-inverting input of the second amplifier 202. In an example, a matching capacitor 212 can be coupled between the non-inverting input of the second amplifier 202 and a reference potential of the signal source 208 to provide even better performance of the single-ended to differential amplifier circuit 200.

In various examples, the first input 206 can receive a single-ended signal and the second input 209 can receive a common-mode signal. The balanced impedance of the first and second signal paths can allow variation of the common-mode supply 210 to be rejected by the first and second amplifiers 201, 202 as common mode voltage.

For example, imperfections in the common-mode supply 210 can appear at node A 218, shaped by the following transfer function, $$V_A = \frac{V_{CM}}{1 + j\omega Z C_{in}},$$

wherein $V_A$ is the voltage at node A 218, Z is the impedance of the first impedance network 207, $C_{in}$ is the capacitance of the signal source 208, and $V_{CM}$ is the common-mode voltage waveform of the common-mode supply 210.

Imperfections of the common-mode supply can appear at node B 219, shaped by the following transfer function, $$V_B = \frac{V_{CM}}{1 + j\omega Z C_m},$$

wherein $V_B$ is the voltage at node B 219, Z is the impedance of the second impedance network 211, $C_m$ is the capacitance of the matching capacitor 212, and $V_{CM}$ is the common-mode voltage waveform of the common-mode supply 210.

Thus, where $C_m$ is close to $C_{in}$, imperfections of the common-mode supply $V_{CM}$ can appear as common mode voltage and can be rejected by the first and second amplifiers 201, 202. Consequently, the AC coupled voltage of the signal source 208 can be amplified on the differential outputs of the single-ended to differential amplifier circuit 200 with little or no distortion. The matched impedance of the illustrated example of FIG. 2 can also provide better power supply rejection of the overall circuit, thus, reducing costs associated with integrating and maintaining larger power supplies for the circuit.

It is understood that other integrated circuits using an integrated circuit, high-impedance network to provide lower frequency poles and/or balanced high impedances are possible without departing from the scope of the present subject matter.

Figure 3:
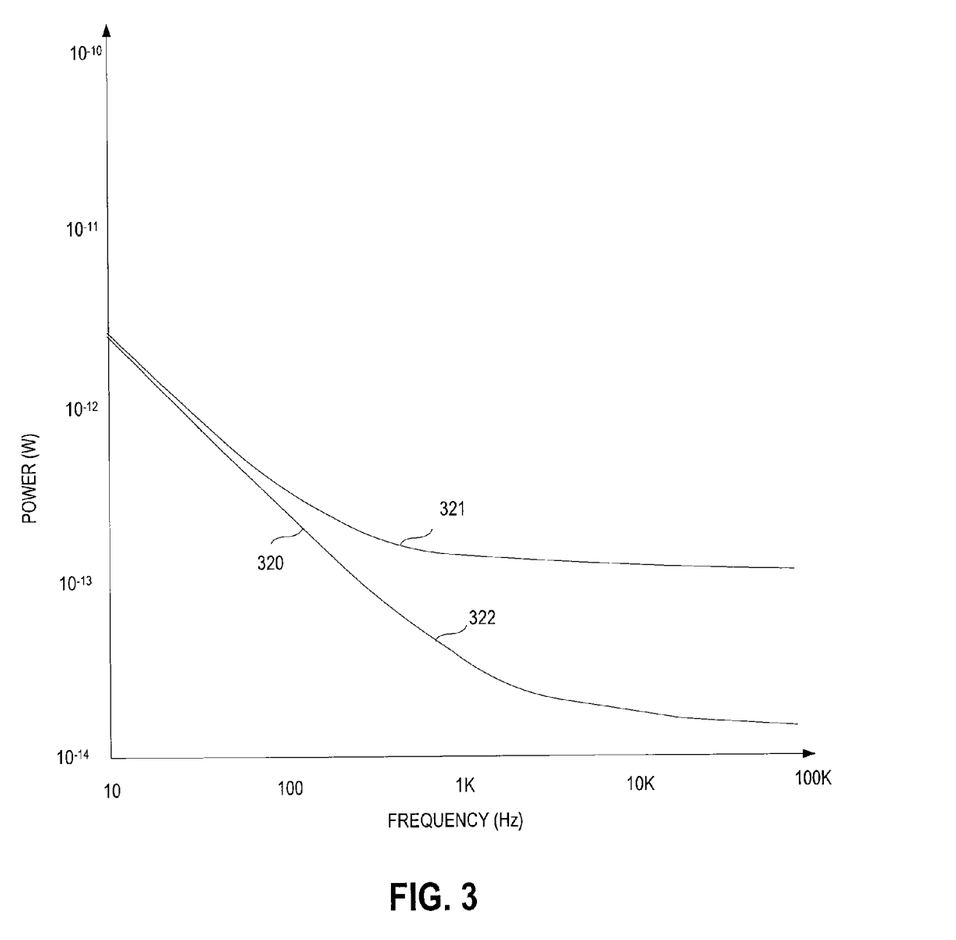
FIG. 3 illustrates generally an example of a relationship between noise power and frequency for the example circuits of FIGS. 1-2.

FIG. 3 illustrates generally an example of a relationship between output noise power and frequency for the example circuits of FIGS. 1-2. The graph shows first results 320 associated with a single-ended to differential amplifier circuit similar to that shown in FIG. 1 modeled using an ideal common-mode voltage supply. The first results 320 show output noise attributed primarily to the amplifiers of the single-ended to differential amplifier circuit. At the output of the single-ended to differential amplifier circuit, about 17.55 uV of the output signal can be attributed to noise. The graph shows second results 321 associated with a single-ended to differential amplifier circuit similar to that shown in FIG. 1 modeled using a practical common-mode power supply having about 10 uV of RMS variation in a 20 kHz bandwidth. The second results 321 show substantially more noise power when a practical common-mode supply is used compared to when an ideal common-mode supply is used. At the output of the single-ended to differential amplifier circuit, 43.59 uV of the output signal can be attributed to noise. The graph shows third results 322 associated with a single-ended to differential amplifier circuit similar to that shown in FIG. 2 modeled using a common-mode power supply having about 10 uV of RMS variation in a 20 kHz bandwidth. The third results 322 are indistinguishable from the first results 320 using an ideal common-mode voltage supply because the balanced impedance of the single-ended to differential amplifier circuit associated with the third results 322 allows the variation of the common-mode supply to be rejected, as 17.6 uV of the output signal are associated with noise. The improved performance indicates, in an example, that the single-ended to differential amplifier circuit of FIG. 2 can achieve results that allow the single-ended to differential amplifier circuit to use a less than ideal common-mode voltage supply without sacrificing performance. In addition, as discussed below, the first and second high-impedance networks can be integrated with a single-ended to differential amplifier integrated circuit without requiring significant die space. In an example, the single-ended to differential amplifier integrated circuit can include an integrated common-mode voltage source because the improved integrated circuit amplifier can substantially reject the voltage variation often associated with small, integrated circuit, common-mode voltage supplies.

Figure 4:
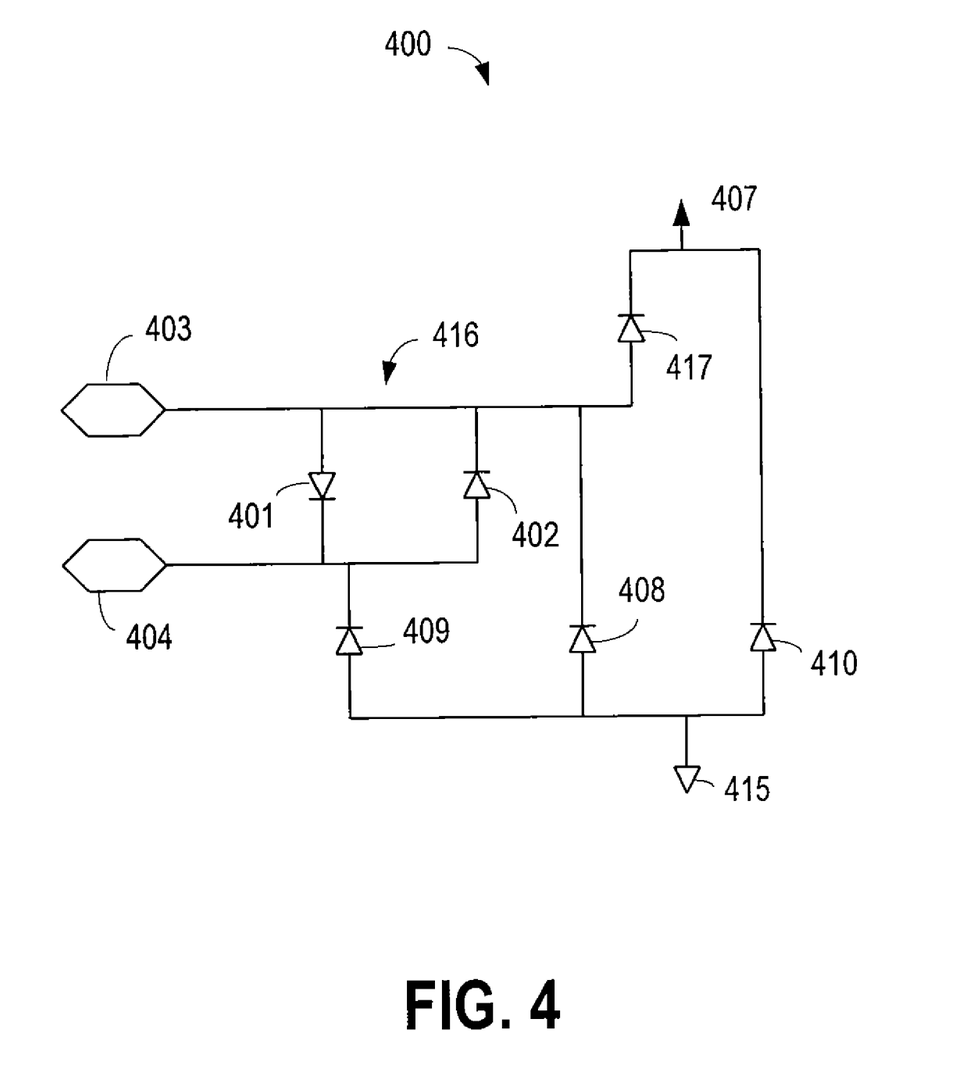
FIG. 4 illustrates generally an example of a circuit diagram for an integrated circuit, high-impedance network.

FIG. 4 illustrates generally an example of a circuit diagram for an integrated circuit, high-impedance network 400, including an anti-parallel diode pair 416 configured to provide high impedance for use, for example, as a first or a second high-impedance network such as that illustrated in FIG. 2. In an example, the anti-parallel diode pair 416 can be fabricated on a common substrate capable of facilitating P-N junctions. In an example, the anti-parallel diode pair includes a first diode 401 and a second diode 402 coupled in an anti-parallel configuration between a first node 403 and a second node 404. In an example, the anti-parallel diode pair 416 can be formed from the emitter-base junction of two transistors. Such a configuration can provide a high-impedance network that utilizes a small die area, such that, for example, the high-impedance network 400 can be fabricated on the same die as an amplifier. In various examples, the formation of the anti-parallel diode pair 416 using the base-emitter junction of two transistors can also provide first, second, and third parasitic diodes 408, 409, 410. The first parasitic diode 408 can be provided by a collector-base junction of one of the anti-parallel diodes. The first parasitic diode 408 can be coupled between the first node 403 and a reference potential 415. When the collector-base junction forming the first parasitic diode 408 is reversed biased, leakage current can create an impedance imbalance in the integrated circuit, high-impedance network 400 compared to when the junction is not reversed biased. The impedance imbalance can result in distortion of a signal coupled to the first input 403. To compensate for the leakage current, a third diode junction 417 can be fabricated on the same chip, and coupled between the first node 403 and a supply voltage node 407. The third diode junction 417 can be sized to provide leakage current that reduces the distortional effect of the leakage current of the first parasitic diode 408 on the signal received at the first node 403. The third diode junction 417, thus, reduces the overall distortion of an amplifier circuit having parasitic structures associated with the integrated circuit, high-impedance network 400.

In an example, the integrated circuit, high-impedance network 400 of FIG. 4 can be used with an amplifier circuit, such as the single-ended to differential amplifier circuit of FIG. 2. In such an example, a first node of a first high-impedance network can couple to a non-inverting input of a first amplifier of the amplifier circuit. A second node of the first high-impedance network can couple to a second node of the amplifier circuit. The first node of a second high-impedance network can couple to the non-inverting input of a second amplifier of the amplifier circuit, and the second node of the second high-impedance network can couple to the second node of the amplifier circuit.

Figure 5A:
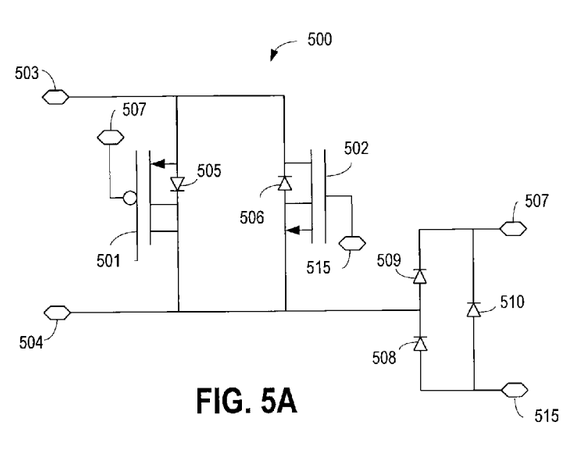
FIG. 5A illustrates generally an example of a circuit diagram for an integrated circuit, high-impedance network.

FIG. 5A illustrates generally an example of a high-impedance network 500 according to an example of the present subject matter. The network 500 includes first and second transistors 501, 502 coupled between a first node 503 and a second node 504 in an anti-parallel diode configuration. In an example, the first transistor 501 can include a PMOS transistor with the source coupled to the first node 503, the drain coupled to the second node 504, and the bulk coupled to the drain. In an example, the gate of the PMOS transistor 501 can be coupled to a power supply, $V_{DD}$, of the network (e.g., an integrated circuit). The configuration of the first transistor 501 can provide an anode of a first diode junction 505 coupled to the first node 503 and a cathode of the first diode junction 505 coupled to the second node 504. In an example, the second transistor 502 can include an isolated NMOS transistor with the drain coupled to the first node 503, the source coupled to the second node 504, and the p-type bulk coupled to the source. In an example, the gate of the second transistor 502 can be coupled to a reference potential, GND, of the network 500. In an example, a isolation well 514 (not shown in FIG. 5A) of the second transistor 502 can be coupled to a power supply, $V_{DD}$, of the integrated circuit. The configuration of the second transistor 502 can provide an anode of a second diode junction 506 coupled to the second node 504 and a cathode of the second diode junction 506 coupled to the first node 503. The combined configuration of the first and second diode junctions 505, 506 can provide a high-impedance network including an anti-parallel diode pair without parasitic diode junctions affecting a signal received on the first node 503 of the anti-parallel diode pair.

In an example, one or more high-impedance network configurations, such as the example of FIG. 5A, can be implemented efficiently in an integrated circuit. The illustrated network 500 can provide extremely high impedance using very little die area of an integrated circuit. In some examples, an integrated circuit can include an amplifier circuit including one or more high-impedance networks, such as the single-ended to differential amplifier circuit 200 of FIG. 2. When implemented within an integrated circuit, first, second, and third parasitic diode junctions 508, 509, 510 can be formed in the semiconductor structure in addition to the first and second diode junctions 505, 506 of interest. The use of anti-parallel first and second diode junctions 505, 506 of different species can eliminate effects of the first, second, and third parasitic diodes 508, 509, 510 on a signal received at node 503. For example, the network 500 of FIG. 5A can provide a signal path between the first and second nodes 503, 504 that includes only the anti-parallel first and second diode junctions 505, 506.

Figure 5B:
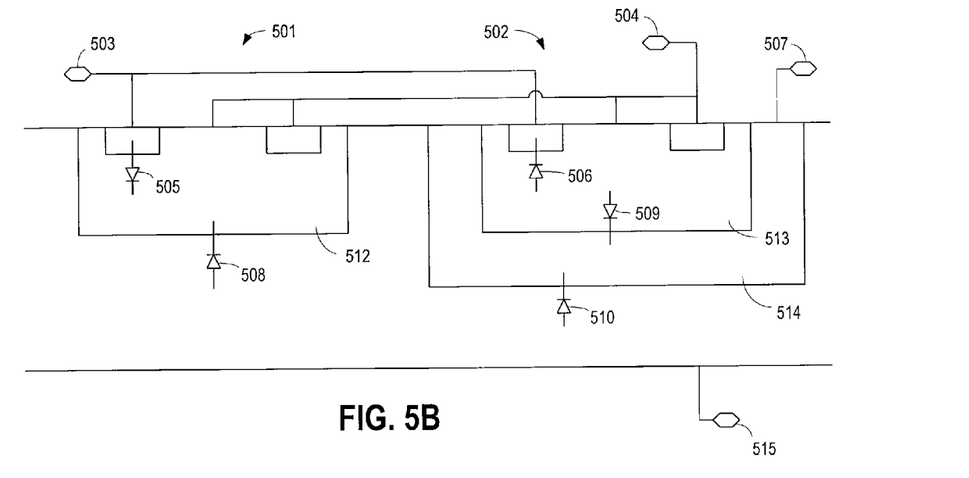
FIG. 5B illustrates generally a silicon cross-section of a portion of an integrated circuit, high-impedance network.

FIG. 5B illustrates generally an example of a side view of a portion of an integrated circuit including a high-impedance network according to an example of the present subject matter. The integrated circuit includes a common substrate 511 supporting a first transistor 501 and a second transistor 502. The first transistor 501 can include a PMOS transistor and can provide a first diode junction 505, a P+/$N_{WELL}$ junction, for a high-impedance network. The second transistor 502 can include an insulated NMOS transistor and can provide a second diode junction 506, an N+/$P_{WELL}$ junction, for the high-impedance network. In an example, the structure of the first and second transistors 501, 502 can provide a first, second, and third 510 parasitic diode junction. For example, a first parasitic diode junction 508 can be formed from the interface between the substrate 511 and the bulk 512 of the first transistor 501. In an example, a second parasitic diode junction 509 can be formed between the bulk 513 of the second transistor 502 and the isolation well 514 of the second transistor 502. In an example, a third parasitic diode junction 510 can be formed between the substrate 511 and the isolation well 514 of the second transistor 502. In an example, the parasitic diodes 508, 509, 510 can be coupled to a supply voltage 507 and a reference potential 515 of the integrated circuit and can be benign to the operation of the network 500, as well as, a circuit including the network, for example, a single-ended to differential amplifier circuit.

In an example, the first diode 505 and the second diode 506 can be formed using a partial transistor structure, for example MOS transistors without a gate structure. In an example, the first diode 505 can include a P+/$N_{WELL}$ junction and the second diode 506 can include a N+/$P_{WELL}$ junction. In an example, the first and second diodes 505, 506 can be formed on a common substrate. In an example, multiple first diodes and multiple second diodes can be formed on a common substrate, including a substrate common to additional integrated circuit elements, such as, for example, amplifier elements.

In an example, the integrated circuit, high-impedance networks of FIGS. 5A-5B can be used with an amplifier circuit, such as the single-ended to differential amplifier circuit of FIG. 2. In such an example, a first node of a first high-impedance network can couple to the non-inverting input of a first amplifier of the amplifier circuit. A second node of the first high-impedance network can couple to a second node of the amplifier circuit. The first node of a second high-impedance network can couple to the non-inverting input of a second amplifier of the amplifier circuit, and the second node of the second high-impedance network can couple to the second node of the amplifier circuit.

In various examples, an integrated circuit, high-impedance network according to an example of the present subject matter can have a resistance of about 10 gigaohms, or in certain examples higher. In an example, a high-impedance network according to the present subject matter, integrated with an integrated circuit amplifier, can allow extremely low frequency poles of the amplifier. In some examples, the low frequency poles can be as low as a fraction of a hertz. Such characteristics can allow the network to be used in audio circuits, microphone circuits, accelerometer circuits, and other circuits including other human interface circuits. In addition, the integrated circuit implementation of the high-impedance network can be adaptable to various semiconductor process technologies, as well as substrate technologies capable of facilitating P-N junctions, including bulk silicon and silicon-on-insulator (SOI) technologies such as silicon-on-sapphire (SOS), or one or more other technologies.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An integrated circuit comprising:
   an amplifier circuit having a first input configured to receive a single-ended signal, a second input, and a differential output configured to provide an amplified representation of the single-ended signal; and
   a filter circuit configured to balance an common-mode voltage between the first and second inputs of the amplifier circuit, the filter circuit including:
      a common-mode input configured to receive the common-mode voltage;
      a first impedance network coupled between the common-mode input and the first input of the amplifier circuit; and
      a second impedance network coupled between the common-mode input and the second input of the amplifier circuit; and
   wherein the filter circuit is configured to provide a low frequency pole below 1 hertz.

2. The integrated circuit of claim 1, wherein the impedance of the first and second impedance networks are substantially equivalent.

3. The integrated circuit of claim 1, wherein the amplifier circuit includes a capacitor coupled between the second input and a reference of the single-ended signal, the capacitor configured to provide capacitance corresponding to a capacitance of a signal source coupled to the first input.

4. The integrated circuit of claim 3, wherein the capacitor includes a capacitance equal to or higher than the capacitance of the signal source.

5. The integrated circuit of claim 1, wherein at least one of the first impedance network and the second impedance network includes first and second diodes coupled as an antiparallel diode pair between the common-mode input and the first input.

6. The integrated circuit of claim 5, wherein the first diode includes a P+/N$_{WELL}$ junction.

7. The integrated circuit of claim 6, wherein the first diode includes a PMOS transistor including the P+/N$_{WELL}$ junction.

8. The integrated circuit of claim 5, wherein the second diode includes a N+/P$_{WELL}$ junction.

9. The integrated circuit of claim 8, wherein the second diode includes a NMOS transistor including the P+N$_{WELL}$ junction.

10. The integrated circuit of claim 9, wherein the NMOS transistor includes a deep N-well configured to isolate a circuit substrate from the NMOS transistor.

11. The integrated circuit of claim 5, wherein the first diode includes a base/emitter junction of a first PNP transistor.

12. The integrated circuit of claim 11, wherein the second diode includes a base/emitter junction of a second PNP transistor.

13. The integrated circuit of claim 5, wherein the first diode and the second diode include a common substrate.

14. The integrated circuit of claim 13, wherein the common substrate includes a silicon-on-sapphire substrate.

15. The integrated circuit of claim 1, wherein the integrated circuit includes a common-mode signal source coupled to the common-mode input.

16. An integrated circuit comprising:
   a filter circuit configured to balance an common-mode voltage between first and second inputs of an amplifier circuit, the filter circuit including:
      a common-mode input configured to receive the common-mode voltage;
      a first impedance network coupled between the common-mode input and the first input of the amplifier circuit; and
      a second impedance network coupled between the common-mode input and the second input of the amplifier circuit; and
   wherein the filter circuit is configured to provide a low frequency pole below 1 hertz.

17. The integrated circuit of claim 16, including the amplifier circuit, wherein the first input is configured to receive a single-ended signal, and wherein the amplifier circuit includes a differential output configured to provide an amplified representation of the single-ended signal.

18. The integrated circuit of claim 17, wherein the impedance of the first and second impedance networks are substantially equivalent.

19. The integrated circuit of claim 18, wherein the apparatus includes an integrated circuit, the integrated circuit including the amplifier circuit and the filter circuit.

20. The integrated circuit of claim 19, wherein the integrated circuit includes a common-mode signal source coupled to the common-mode input.

21. A method comprising:
   balancing a common-mode voltage between first and second inputs of an amplifier circuit using a filter circuit having a low frequency pole below 1 hertz, and first and second impedance networks, the balancing using a integrated circuit including the amplifier circuit and the filter circuit;
   wherein the balancing includes:
      receiving the common-mode voltage at an common-mode input of the filter circuit;
      filtering the common-mode voltage to the first input of the amplifier circuit using the first impedance network; and
      filtering the common-mode voltage to the second input of the amplifier circuit using the second impedance network.

22. The method of claim 21, including:
   receiving a single-ended signal at first input of the amplifier circuit; and
   providing an amplified representation of the single-ended signal at a differential output of the amplifier circuit.

23. The method of claim 22, wherein the impedance of the first and second impedance networks are substantially equivalent.

24. The method of claim 22, wherein the balancing the common-mode voltage includes using an integrated circuit including the filter circuit and the amplifier circuit.

25. The method of claim 24, including providing the common-mode signal to the common-mode input of the filter circuit using a common-mode signal source, wherein the integrated circuit includes the common-mode signal source.

* * * * *